(12) United States Patent
Wu

(10) Patent No.: US 8,741,037 B2
(45) Date of Patent: Jun. 3, 2014

(54) COMPOSITION OF PALLADIUM UNSATURATED CARBOXYLATE AND PALLADIUM NANOPARTICLES

(75) Inventor: Yiliang Wu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 196 days.

(21) Appl. No.: 13/365,001

(22) Filed: Feb. 2, 2012

(65) Prior Publication Data

US 2013/0202795 A1     Aug. 8, 2013

(51) Int. Cl.
*C23C 18/44* (2006.01)
*B05D 3/02* (2006.01)
*B05D 5/12* (2006.01)

(52) U.S. Cl.
USPC ... 106/1.21; 106/1.28; 427/126.1; 427/376.7; 427/383.1

(58) Field of Classification Search
USPC ........ 106/1.21, 1.28; 427/126.1, 376.7, 383.1
See application file for complete search history.

(56) References Cited

U.S. PATENT DOCUMENTS

| | | | | |
|---|---|---|---|---|
| 5,894,038 | A * | 4/1999 | Sharma et al. | 427/554 |
| 6,572,673 | B2 * | 6/2003 | Lee et al. | 75/362 |
| 6,878,184 | B1 * | 4/2005 | Rockenberger et al. | 75/343 |
| 7,315,068 | B2 * | 1/2008 | Haubrich et al. | 257/412 |
| 8,110,254 | B1 * | 2/2012 | Sharma et al. | 427/555 |
| 8,361,350 | B2 * | 1/2013 | Wu et al. | 252/514 |
| 8,419,822 | B2 * | 4/2013 | Li | 75/371 |
| 8,568,824 | B2 * | 10/2013 | Wu et al. | 106/1.15 |
| 8,574,665 | B2 * | 11/2013 | Wu et al. | 106/1.15 |
| 8,613,796 | B1 * | 12/2013 | Wu et al. | 106/1.15 |
| 2009/0148600 | A1 * | 6/2009 | Li et al. | 427/256 |
| 2013/0200312 | A1 * | 8/2013 | Wu | 252/514 |
| 2013/0221288 | A1 * | 8/2013 | Liu et al. | 252/514 |

OTHER PUBLICATIONS

Office Action dated Oct. 23, 2013 issued in Canadian Patent Application No. 2,804,136.
U.S. Appl. No. 13/290,825, filed Nov. 8, 2011.
U.S. Appl. No. 13/153,856, filed Jun. 6, 2011.
U.S. Appl. No. 11/950,450, filed Dec. 5, 2007.
U.S. Appl. No. 13/364,961, filed Feb. 2, 2012.

* cited by examiner

*Primary Examiner* — Helene Klemanski
(74) *Attorney, Agent, or Firm* — Oliff PLC

(57) ABSTRACT

A palladium first composition is disclosed, including a palladium salt and an unsaturated carboxylic acid, wherein the composition is substantially free of water, and wherein the first composition forms a second composition including stable palladium nanoparticles and a palladium unsaturated carboxylate. The composition permits the use of solution processing methods to form a palladium layer on a wide variety of substrates, including in a pattern to form circuitry or pathways for electronic devices.

22 Claims, 2 Drawing Sheets

COMPOSITION OF PALLADIUM UNSATURATED CARBOXYLATE AND PALLADIUM NANOPARTICLES

BACKGROUND

The present disclosure relates to compositions and processes for depositing and forming palladium layers on various substrates. The compositions may be flowable solutions or pastes, for example, and used to coat and/or print objects such as electronic devices or components thereof by solution deposition processes including spin coating, dip coating, screen printing, and inkjet printing.

Palladium (Pd) is a rare metal with many unique properties, resulting in its widespread use. For example, palladium is used in catalytic converters of automobiles to convert combustion byproducts into less harmful substances. Palladium is also used in many electronics devices, ceramic capacitors, fuel cells, and so on. Palladium layers/structures are conventionally formed in such devices by electroplating, sputtering, or chemical vapor deposition (CVD).

It would be desirable to use lower-cost approaches to form palladium structures. For example, there is a need for solution-processable compositions that can be used for palladium deposition.

SUMMARY

Disclosed is a composition comprising palladium nanoparticles that may be used to form palladium layers and/or structures on a variety of substrates and methods for forming the same. These compositions are useful for coating and printing substrates, such as in a pattern to form a palladium layer, and can be used for fabricating electronically conductive elements, pathways, and/or circuits of electronic devices. The resulting palladium layers and/or structures are substantially uniform and exhibit high conductivity and good adhesion.

A process for forming a composition comprising palladium nanoparticles includes warming a first composition comprising at least one palladium salt and at least one unsaturated carboxylic acid to form a second composition comprising stable palladium nanoparticles and at least one palladium unsaturated carboxylate, wherein the first composition is substantially free of an additional reducing agent.

Also, a composition comprising at least one palladium unsaturated carboxylate and stable palladium nanoparticles is described, which is formed by a process including warming a first composition to form a second composition comprising the at least one palladium unsaturated carboxylate and stable palladium nanoparticles, wherein the first composition is substantially free of an additional reducing agent.

A method for forming a palladium layer on a substrate is also described, the method warming a first composition comprising at least one palladium salt and at least one unsaturated carboxylic acid to form a second composition comprising stable palladium nanoparticles and at least one palladium unsaturated carboxylate, wherein the first composition is substantially free of an additional reducing agent; solution depositing the second composition upon the substrate; and heating the second composition on the substrate to form the palladium layer.

Also, a palladium layer is described. The palladium layer is formed from a composition comprising both palladium nanoparticles and palladium unsaturated carboxylate. The palladium layer has a conductivity at least 1000 S/cm. The palladium layer has a surface roughness less than 10 nm.

BRIEF DESCRIPTION OF THE DRAWINGS

The following is a brief description of the drawings, which are presented for the purposes of illustrating an example embodiment disclosed herein.

EMBODIMENTS

Figure 1:
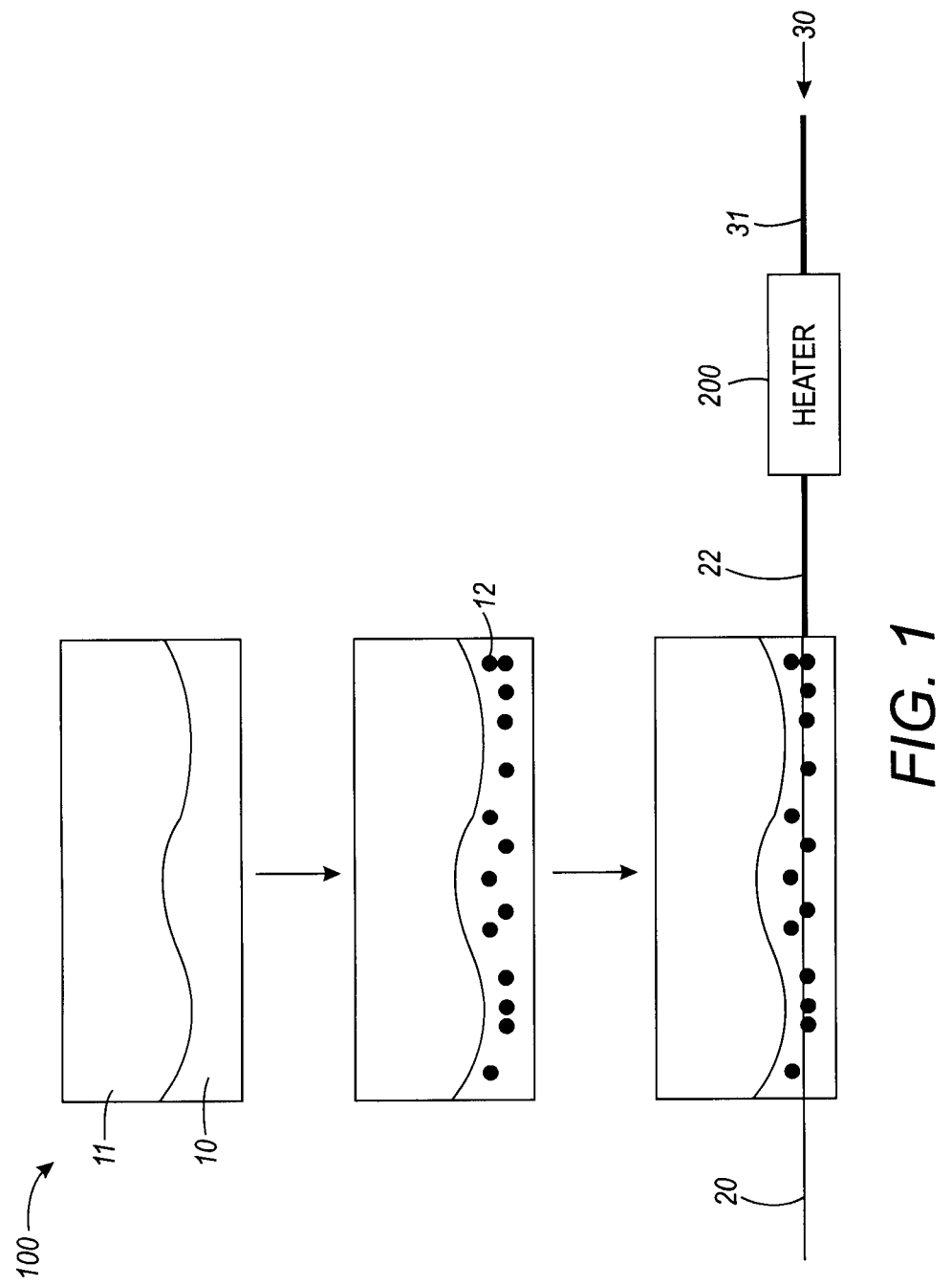
FIG. 1 is a schematic diagram showing the process of coating a substrate, for example, a wire, according to the present disclosure.

The term "room temperature" refers to a temperature of about 20° C. to about 25° C.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

The use of the singular terms "a", "an", and "the" should be construed to include plural referents as well, unless clearly indicated otherwise by the context. Put another way, these singular terms should be construed as "at least one".

The term "unsaturated" means a state in which not all of the available valence bonds along an alkly chain are satisfied, meaning that at least 2 carbon atoms are connected by at least one double bond. Thus, the phrase "unsaturated carboxylic acid" refers to carboxylic acids that include at least one carbon-carbon double bond that is not part of an aromatic ring.

The term "organo" as used herein refers, for example, to the presence of carbon atoms, although the organo group may include heteroatoms such as, for example, nitrogen, oxygen, sulfur, phosphorus, silicon, fluorine, chlorine, bromine, iodine and the like. Further, the organo group may be linear, cyclic, branched and the like.

In addition, palladium salt is a molecular compound. Pd—Pd bonds may be present in the molecular compound. However, the palladium salt is not a nanoparticle or similar material. The palladium atom in the salt is not zero valent, while palladium atoms are zero valent in the nanoparticle form. For example, the palladium in the palladium salt is Pd (II) while the palladium in the palladium nanoparticles is Pd (0).

A process for forming a composition comprised of palladium nanoparticles is described, which includes warming a first composition comprising at least one palladium salt and at least one unsaturated carboxylic acid to form a second composition comprising stable palladium nanoparticles and at least one palladium unsaturated carboxylate. The process may exclude, for example, isolating the palladium nanoparticles after warming the first composition. In other words, the palladium nanoparticles are formed in-situ together with the palladium unsaturated carboxylate. The second composition is not formed by mixing two separated entities, the palladium nanoparticle and the palladium unsaturated carboxylate, together.

The first composition may, for example, not contain any water. However, this does not require an absolute absence of water. Some residual water may be present in the first composition from the various ingredients or from ambient/atmospheric conditions.

The palladium salt may be any palladium salt. For example, the palladium salt may be the formula

where X is any counter ion to palladium, and mixtures thereof. The palladium salt may be selected from, for example, palladium acetate, palladium chloride, palladium nitrate, palladium sulfate, palladium iodide, palladium cyanide, ethylenediamine palladium chloride, tetraaminepalladium bromide, bis(acetylacetonato)palladium, diamine dinitro palladium, and mixtures thereof. In embodiments, the palladium salt is palladium acetate.

The palladium salt may compose from about 1 to about 50 weight percent (wt %) of the first composition, for example, the palladium salt makes up from about 5 wt % to about 40 wt % of the first composition, or from about 5 wt % to about 30 wt % of the first composition.

The unsaturated carboxylic acid is any unsaturated carboxylic acid that contains at least 2 carbons connected by at least one double bond or at least one triple bond. The unsaturated carboxylic acid may be any unsaturated carboxylic acid of the formula:

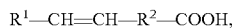

wherein $R^1$ represents a hydrogen or a hydrocarbon group having from about 1 carbon atom to about 25 carbon atoms, and $R^2$ represents a hydrocarbon group having from about 1 to about 25 carbon atoms, wherein the hydrocarbon group of $R^1$ and/or $R^2$ is independently selected from the group consisting of a substituted or unsubstituted alkyl, alkenyl, alkynyl, aryl and mixtures thereof. For example, the number of carbon atoms in the range may be from about 4 to about 20 carbon atoms, or from about 8 to about 18 carbon atoms. For example, $R^1$ may be hydrogen. In addition, R1 and/or $R^2$ may be alkyl, an alkenyl, an alkynyl, and an aryl. Hydrogen atoms on $R^1$ or $R^2$ may be substituted with another functional group such as —CHO, —OH, halogen, and the like. For example, the unsaturated carboxylic acid may be oleic acid heptenoic acid, octenoic acid, citronellic acid, 2-ethyl-2-hexenoic acid, dimethyl-4-pentenoic acid, crotonic acid, vinylacetic acid, tiglic acid, pentenoic acid, 2-methyl-2-pentenoic acid, undecylenic acid, myristoleic acid, palmitoleic acid, elaidic acid, eicosenoic acid, erucic acid, nervonic acid, trans-2,4-pentadienoic acid, 2-4-hexadienoic acid, 2,6-heptadienoic acid, geranic acid, linoleic acid, eicosadienoic acid, linolenic acid, eicosatrienoic acid, arachidonic acid, eicosapentaenoic acid, docosahexaenoic acid, itaconic acid, citraconic acid, mesaconic acid, traumatic acid, muconic acid, and the like, and mixtures thereof. In embodiments, the unsaturated carboxylic acid is oleic acid, octenoic acid, and/or undecylenic acid.

The term "aryl" refers to an aromatic radical composed entirely of carbon atoms and hydrogen atoms. When aryl is described in connection with a numerical range of carbon atoms, it should not be construed as including substituted aromatic radicals. For example, an aryl containing from 6 to 10 carbon atoms should be construed as referring to a phenyl group (6 carbon atoms) or a naphthyl group (10 carbon atoms) only, and should not be construed as including a methylphenyl group (7 carbon atoms).

The term "substituted" refers to at least one hydrogen atom on the named radical being substituted with another functional group, such as halogen, hydroxyl, mercapto (—SH), —CN, —NO₂, —COOH, and —SO₃H. An example of a substituted alkyl group is a perhaloalkyl group, wherein one or more hydrogen atoms in an alkyl group are replaced with halogen atoms, such as fluorine, chlorine, iodine, and bromine. Besides the aforementioned functional groups, an aryl or heteroaryl group may also be substituted with alkyl or alkoxy. For example, substituted aryl groups include methylphenyl and methoxyphenyl.

The term "alkyl" refers to a radical composed entirely of carbon atoms and hydrogen atoms which is fully saturated and of the formula —$C_nH_{2n+1}$. The alkyl radical may be linear, branched, or cyclic, wherein n represents a number greater than or equal to 1.

The term "alkenyl" refers to a radical composed entirely of carbon atoms and hydrogen atoms which contains at least one carbon-carbon double bond. An alkenyl radical may be linear or branched.

The term "alkynyl" refers to a radical composed entirely of carbon atoms and hydrogen atoms which contains at least one carbon-carbon triple bond.

The molar ratio of the unsaturated carboxylic acid to the palladium salt may be from about 1:5 to about 10:1. For example, the molar ratio of unsaturated carboxylic acid to palladium salt is from about 1:1 to about 10:1, or from about 2:1 to about 10:1, or from about 2:1 to about 5:1.

The unsaturated carboxylic acid(s) present in the first composition may be immiscible in water. Generally, water immiscible unsaturated carboxylic acids contain at least about 4 carbon atoms per carboxylic acid group. For example, water immiscible unsaturated carboxylic acids include aliphatic carboxylic acids of the formula HOOC—$R^3$, where $R^3$ is alkenyl having from about 4 to about 25 carbon atoms, or from about 8 to about 18, for example, $R^3$ may be a linear alkenyl chain.

The unsaturated carboxylic acid may function as a solvent, with the palladium salt being dissolved in the unsaturated carboxylic acid. The unsaturated carboxylic acid should thus be in the liquid phase. The molar ratio of the unsaturated carboxylic acid to the palladium salt may be at least about 2:1 to ensure dissolution of the palladium salt in the unsaturated carboxylic acid.

However, this does not mean the unsaturated carboxylic acid must have a melting point less than about room temperature. The temperature of the first composition may be greater than room temperature in order for the unsaturated carboxylic acid to be in the liquid phase. For example, the unsaturated carboxylic acid may have a melting point less than about 50° C., or a melting point of less than about 40° C., including a melting point less than room temperature. The liquid phase/low melting point is advantageous in achieving a uniform palladium layer. For example, an unsaturated carboxylic acid with a high melting point may crystallize out after deposition, which may cause high surface roughness and holes in the final palladium layer.

In forming the second composition, the temperature of the first composition may be warmed from room temperature up to about 160° C., including from room temperature to about 150° C., or including from room temperature to about 110° C. At least a portion, and in some cases all, of this temperature increase may occur with no external heat source, for example due to an exothermal reaction between the palladium salt and the unsaturated carboxylic acid.

The unsaturated carboxylic acid is not required to be the sole solvent of the first composition. The first composition may also comprise a second solvent to dissolve the palladium salt and/or the unsaturated carboxylic acid, for example, when the palladium salt does not completely dissolve in the unsaturated carboxylic acid solvent. Another organic solvent, which may be immiscible with water, may be included. Water immiscible means, for example, when a given organic solvent is mixed with water at about equal amounts by volume, if a phase separation is detected (either visually or by instruments such as light scattering or refractive index) after settling, the solvent is considered to be water immiscible. The palladium salt, the unsaturated carboxylic acid, and the resulting palladium unsaturated carboxylate and palladium nanoparticles should be soluble in this second solvent. For example, at least about 0.5 wt % of the amount of the given component added to the second solvent should dissolve, including at least about 1 wt %, or at least about 10 wt % of the amount added. The non-soluble portion may be removed from the first composition by, for example, filtration.

Any suitable water immiscible organic solvent may be used for the second solvent. The second organic solvent may be, for example, a hydrocarbon solvent, for example a substituted hydrocarbon, an aromatic hydrocarbon, a ketone, ester, ether, and the like. The hydrocarbon solvent may, for example have at least 6 carbon atoms, from 6 to about 25 carbon atoms. For example, the solvent may be include toluene, xylene, mesitylene, ethylbenzene, diethylbenzene, trimethylbenzene, methyl ethylbenzene, tetrahydronaphthalene, chlorobenzene, dichlorobenzene, trichlorobenzene, chlorotoluene, methyl isobutyl ketone, methyl benzoate, benzyl benzoate, anisole, cyclohexanone, acetophenone, decalin, heptane, hexane, benzene, cyclohexane, pentane, ethylbenzene, octane, decane, dodecane and the like, and mixtures thereof. The second organic solvent may have a boiling point of at least about 80° C., at least about 100° C., or at least 150° C.

Water and/or a water miscible solvent may be present in the first composition. Any suitable concentration of the water and/or water miscible solvent(s) may be present. For example, the amount of water and/or water miscible solvent (by weight) may be less than the amount of unsaturated carboxylic acid. Examples of water miscible solvents include alcohols such as methanol, ethanol, propanol, and butanol; glycols; acetone; tetrahydrofuran (THF); dichloromethane; ethyl acetate; dimethylformamide (DMF); dimethyl sulfoxide (DMSO); acetic acid; acetonitrile; and dioxane.

The unsaturated carboxylic acid may also function as a reducing agent. Therefore, the first composition may, for example, not contain any additional reducing agents, or may be substantially free of additional reducing agents, other than the unsaturated carboxylic acid, and additional reducing agents need not be separately added as an additional processing step. Examples of reducing agents that may, for example, be excluded in the first composition are formic acid and formic acid salts or esters, hypophosphites, hydrazines, ammonium compounds, amine borane compounds, alkali metal borohydrides, oxalic acid, alkali or alkaline earth sulfites, and the like.

The unsaturated carboxylic acid may also function as a complexing agent. A complexing agent refers, for example, to a compound that is attached to the central atom of a coordination compound. A coordination compound refers, for example, to a compound formed from the union of a metal ion with a nonmetallic complexing agent.

In addition, the composition may further comprise an organoamine as a further complexing agent. The organoamine contains, for example, from about 1 carbon atom to about 20 carbon atoms, from about 2 to about 18 carbon atoms, from about 4 to about 16 carbon atoms or from about 12 to about 16 carbon atoms. Examples of organoamines may include methylamine, ethylamine, propylamine, butylamine, pentylamine, hexylamine, heptylamine, octylamine, nonylamine, decylamine, hexadecylamine, undecylamine, dodecylamine, tridecylamine, tetradecylamine, dimethylamine, dipropylamine, dibutylamine, dipentylamine, dihexylamine, diheptylamine, dioctylamine, dinonylamine, didecylamine, oleylamine, allylamine, geranylamine, N-methylallylamine, diallylamine, 2-(1-cyclohexenyl)ethylamine, 3-pyrroline, 1,2,3,6-tetrahydropyridine, N-methyl-2-methylallylamine, and the like, and mixtures thereof.

The second composition comprising palladium nanoparticles with a stability of at least 1 day and an unsaturated carboxylate may form at room temperature without any warming. However, in order to speed the formation of a second composition comprising palladium nanoparticles with a stability of at least 1 day and an unsaturated carboxylate, the first composition may be warmed to a temperature of about 30° C. to about 150° C., for example, about 30° C. to about 100° C., such as about 30° C. to about 80° C. or less. This elevated temperature may be achieved through warming via an external heat application, through an exothermic reaction between the at least one palladium salt and the at least one unsaturated carboxylic acid, or a combination of both.

The first composition may be taken to the above-described temperature for a period of about 0.1 seconds to about 60 minutes, for about 1 second to about 45 minutes, or from about 10 seconds to about 30 minutes, in order to form palladium nanoparticles.

The temperature increase above may occur due to warming from the application of heat from an external heat source, for example, a hot plate, Bunsen burner, oven, microwave, water bath, warm air, IR irradiation, or the like, and combinations thereof. In addition, at least a portion of the warming may occur with no external heat source applied, for example, due to an exothermic reaction between the palladium salt and the unsaturated carboxylic acid.

During the warming, at least a portion of the palladium salt and unsaturated carboxylic acid react to form palladium nanoparticles and an palladium unsaturated carboxylate. For example, the molar ratio of the palladium unsaturated carboxylate to the palladium nanoparticles is from about 99:1 to about 1:99, including from about 90:10 to about 10:99, or from about 60:40 to about 40:60, based on the mole of palladium atom, or for example, a majority of the unsaturated carboxylic acid and palladium salts react to form palladium nanoparticles and an palladium unsaturated carboxylate. The formation of palladium nanoparticles is evidenced, for example, by a color change of the unsaturated carboxylic acid upon warming. For example, a black color may be observed, indicating that palladium nanoparticles have been formed during the warming step.

The warming of the first composition forms a second composition comprising palladium nanoparticles and a palladium unsaturated carboxylate. The second composition may also comprise ingredients of the first composition, for example, a solvent and may also contain non-complexed unsaturated carboxylic acid and/or non-complexed palladium salt, for example, due to an incomplete reaction of the first composition.

The second composition may be in the form of a liquid or a semisolid, such as a paste. The second composition may have a viscosity of about 5 cps to about 5,000 cps, for example from about 5 cps to about 2,500 cps, or from about 5 cps to about 1,000 cps at room temperature, from about 5 cps to about 50 cps at room temperature. For example, the second composition may be a paste with a viscosity of at least about 100 cps. Viscosity is determined, for example with rheometers such as Brook Field Rheometers at 25° C. with a rate sweep from $1000\ s^{-1}$ to $0.1\ s^{-1}$.

The palladium unsaturated carboxylate may be of the formula:

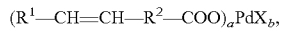
$(R^1-CH=CH-R^2-COO)_a PdX_b$, where $R^1$ and $R^2$ are the same as in the first composition, X represents a counter ion to palladium, and "a" represents the number of the unsaturated carboxylate(s) complexed with palladium, and "b" represents the number of counter ion(s) 1, where a and b are real numbers or fractions, as long as a is larger than zero and a+b=2. For example, the palladium unsaturated carboxylate is of the formula a+b=2, where "a" may be about 2, and "b" is zero, or "a" may be 1.8, and "b" may be 0.2. For example, palladium unsaturated carboxylate comprises at least 3 carbon atoms to about 25 carbon atoms, such as from about 4 to 25 carbon atoms, 6 to 20 carbon, or 8 to 18 carbon atoms. The composition may also contain non-complexed unsaturated carboxylic acid and/or non-complexed palladium salt.

Without being limited by this theory, it is theorized that the double bond of the unsaturated carboxylic acid may contribute to the formation of stable palladium nanoparticles. The unsaturated carboxylic acid will reduce the palladium salt to form nanoparticles; meanwhile the carboxyl group of the unsaturated carboxylic acid will interact with the surface of the nanoparticle immediately after their formation to prevent aggregation of the nanoparticles. In other words, the unsaturated carboxylic acid provide dual functionality, reducing the palladium salt and as stabilizer for the palladium nanoparticles. In addition, the second composition may further comprise at least one unsaturated carboxylic acid. Previously described palladium nanoparticles would combust when exposed to air or aggregate in the second composition. Furthermore, previously described palladium nanoparticles typically required the addition of a second reducing agent which is different from the stabilizer to form the palladium nanoparticles.

In embodiments, the palladium nanoparticle has a particle size less than 100 nm, or less than 50 nm, or less than 20 nm. For example from about 1 nm to about 100 nm, including from about 1 nm to about 50 nm, or from 1 nm to about 20 nm, as determined by TEM.

The palladium should not be considered as a catalyst, for example, as in an organic synthesis reaction. When an organic synthesis reaction contains an unsaturated carboxylic acid reagent, a palladium unsaturated carboxylate may be formed in the organic reaction. This differs from the present disclosure in several aspects. First, the palladium in a synthesis reaction functions as a catalyst, while the palladium in the present first and second compositions provides a metal source for a palladium coating or layer, and does not act as a catalyst. A catalyst refers, for example, to any substance of which a small proportion notably affects the rate of a chemical reaction without itself being consumed or undergoing a chemical change. Second, the carboxylic acid in a synthesis reaction functions as a reactant, while the unsaturated carboxylic acid in the first composition functions as a complexing agent, reducing agent, and/or solvent. Third, palladium is used in a catalytic amount in synthesis reactions, while palladium salt is merely one of the dominant components of the first composition. In general, the present disclosure describes a first and second composition that are non-catalytic compositions. For example, the palladium unsaturated carboxylate is not used in forming a product from two reactants and the unsaturated carboxylic acid does not become part of a third compound.

After the formation of the second composition comprising palladium nanoparticles and the palladium unsaturated carboxylate, the nanoparticles may be stored for future use or may be immediately deposited on a substrate to form, for example, a palladium layer. The palladium nanoparticles need not be isolated from the second composition in order to store or use the second composition.

The second composition may be stored under ambient conditions. For example, the second composition may be stored at room temperature. When stored, the palladium nanoparticles in the second composition may have a stability of at least 1 day, such as, for example, a stability of at least 1 week, at least 1 month, or at least 6 months. Stability can be measured, for example, by visual inspection. For example, when the second composition becomes unstable, the palladium nanoparticles may aggregate. This aggregation may be observed by visual inspection.

In depositing the second composition, the palladium nanoparticles may optionally be isolated from the second composition and deposited on the substrate. However, isolation of the nanoparticles from the second composition is not necessary in order to form a palladium layer on the substrate.

The substrate may be, for example, a metal substrate, for example, copper, silver, aluminum, and nickel, a plastic substrate, for example, polyester, polyimide, polyketone, polysulfone, epoxy, and phenolic resin, and other substrates, for example, glass, paper, ceramic and the like, and mixtures thereof.

In depositing the second composition, a receiving layer can be applied prior to depositing the second composition on the substrate. The receiving layer may enhance the adhesion of the second composition on the object. Any suitable receiving layer can be used, for example, a receiving layer formed from a silane, or a silane comprising an amino group.

The depositing of the second composition and/or the optionally the isolated nanoparticles may be performed for example, by solution depositing. Solution depositing, for example, refers to a process where a liquid is deposited upon the substrate to form a coating or layer. This is in contrast to vacuum depositing processes. The present processes for forming a palladium layer are also different from other solution-based processes, for example electroplating, which requires a plate to remain immersed in a solution and also requires exposure to an electric current to form a metal coating on the plate. The present process also offers several advantages compared to other process such as the decreasing the amount of waste and decreasing the amount of time necessary to coat a substrate. Solution depositing includes, for example, spin coating, dip coating, spray coating, slot die coating, flexographic printing, offset printing, screen printing, gravure printing, or inkjet printing the palladium second composition onto the substrate.

The second composition may be spin coated, for example, for about 10 seconds to about 1,000 seconds, for about 50 seconds to about 500 seconds, or from about 100 seconds to about 150 seconds, onto a substrate at a speed, for example, from about 100 revolutions per minute (rpm) to about 5,000 rpm, from about 300 rpm to about 3,000 rpm, or from about 500 rpm to about 1,500 rpm.

The substrate coated with the second composition and/or the optionally the isolated nanoparticles is then heated to form a palladium layer on the substrate. The heating may be performed at any temperature that does not cause adverse changes in the properties of the previously deposited layer(s) or the substrate (whether a single layer substrate or multilayer substrate), for example, from about 60° C. to about 350° C., from about 90° C. to about 350° C., from about 100° C. to about 300° C., or from about 150° C. to about 250° C. The heating may be performed for a period of up to 60 minutes, and could be for a period as short as 0.1 seconds depending on the size of the palladium layer and the heating method. For example, the period of heating may be from about 0.1 second to about 30 minutes, from about 1 second to about 20 minutes, or from about 1 minute to about 10 minutes.

The heating may be performed in air, in an inert atmosphere (for example, under nitrogen or argon), or in a reducing atmosphere (for example, under nitrogen containing from 1 to about 20 percent by volume hydrogen). The heating can also be performed under normal atmospheric pressure or at a reduced pressure of, for example, from about 1,000 millibars to about 0.01 millibars. Examples of heating techniques may include thermal heating (for example, a hot plate, an oven, and a burner), infra-red ("IR") radiation, a laser beam, flashlight, microwave radiation, or UV radiation, or a combination thereof. This liquid deposition process for forming the palladium layer is different from a conventional electroless plating process, where the palladium salt deposits into a palladium layer directly without going through an intermediate nanoparticle form. The heating causes the palladium nanoparticles to coalesce into a continuous and uniform palladium layer. The palladium nanoparticles enhance uniformity of the final palladium film. The heating induces the palladium nanoparticles to form, for example, an electrically conductive layer, which is suitable for use as an electrically conductive element in electronic devices.

The deposition processes described above may also be repeated to build up a thicker palladium layer on the object. For example, the thickness of the final layer may also be from about 10 nanometers to about 50 micrometers, or from about 50 nanometers to about 30 micrometers, or from about 50 nm to about 5 micrometers, or from about 80 nm to about 1 micrometer. In this regard, multiple solution deposition steps may be performed, with one subsequent heating to form the final layer. Alternatively, the steps of solution deposition followed by heating can be repeated multiple times to build a thick layer out of several thinner layers.

The palladium layer deposited on the substrate may be electrically conductive, and may, for example, be deposited in a predetermined pattern, such as an electrically conductive pathway or circuit on a substrate. The palladium layers produced according to the present disclosure have high conductivity and good adhesion at low temperatures. For example, the conductivity of the palladium layer produced by heating is, for example, from about 100 Siemens/centimeter ("S/cm") to about 50,000 S/cm, from about 1,000 S/cm to about 10,000 S/cm, such as from about 2,000 S/cm, to about 5,000 S/cm, or for example, the conductivity may be at least 1,000 S/cm. Conductivity was measured using the 4-probe method at room temperature.

The palladium layer also may not be electrically conductive. Although heating causes the decomposition of the second composition into palladium film or layer, due to the presence of other ions, for example, from the salt, a residual amount of the unsaturated carboxylic acid and its decomposed form, and/or due to the presence of insulative additives in the first composition such as polymers, the palladium layer may not be conductive.

If desired, additional layers can be applied on top of the palladium layer (the additional layers may be referred to, for example, as overcoat layers). Any layer known in the art may be applied, for example, materials with resistance to scratching. Materials that may be used to form an overcoat layer include, for example, an epoxy resin, a polyurethane, a phenol resin, a melamine resin, a polysiloxane, a poly(silsesquioxane), and the like. Polysiloxane and poly(silsesquioxane) (for example sol-gel approach) can be used to from a highly crosslinked polysiloxane or poly(silsesquioxane) overcoat layer. The overcoat layer may be a crosslinked polysiloxane, a crosslinked poly(silsesquioxane), or a crosslinked layer comprising poly(vinylphenol) and a melamine-formaldehyde resin. The thickness of the overcoat layer may be for example from about 10 nm to about 10 micrometers, including from about 10 nm to about 5 micrometers, or from about 50 nm to about 1 micrometer. The overcoat layer may be colorless to ensure the visibility of the palladium layer.

In addition, the palladium layer has a surface roughness less than about 10 nm, for example, from about 1 nm to less than about 10 nm, from about 2 nm to about 9 nm, or from about 3 nm to about 8 nm. Surface roughness may be determined by any suitable method. Exemplary methods including Atomic Force Microscope, Surface Profilometer, Optical Profilometer, and the like.

FIG. 1 is a schematic diagram illustrating a process described herein. In step 100, a palladium first composition 10 is presented in a vessel 11. The vessel is warmed to a sufficient temperature to induce the formation of palladium nanoparticles 12. A wire 20 is drawn through the coating solution to form a coating 22 on the wire. Any wire could be coated with the palladium second composition, regardless of the diameter, shape, or length of the wire. Both organic materials, for example, plastics, such as polyimide, polyester, polyamide (Nylor), polycarbonate, polyethylene, polyacrylate, and the like and inorganic materials, for example, copper, aluminum, tungsten, zinc oxide, silicon, and the like may be used as the substrate for the wire. The wire may be bare, for example, uncovered with other layers, or may be insulated by the addition of other layers around a core. The wire may be single-stranded, multiple stranded, and/or twisted.

Next in step 200, the coating 22 is annealed by exposure to heat. The result is a wire 30 having a palladium layer 31. The original wire 20 serves as a substrate upon which the palladium layer is located.

Figure 2:
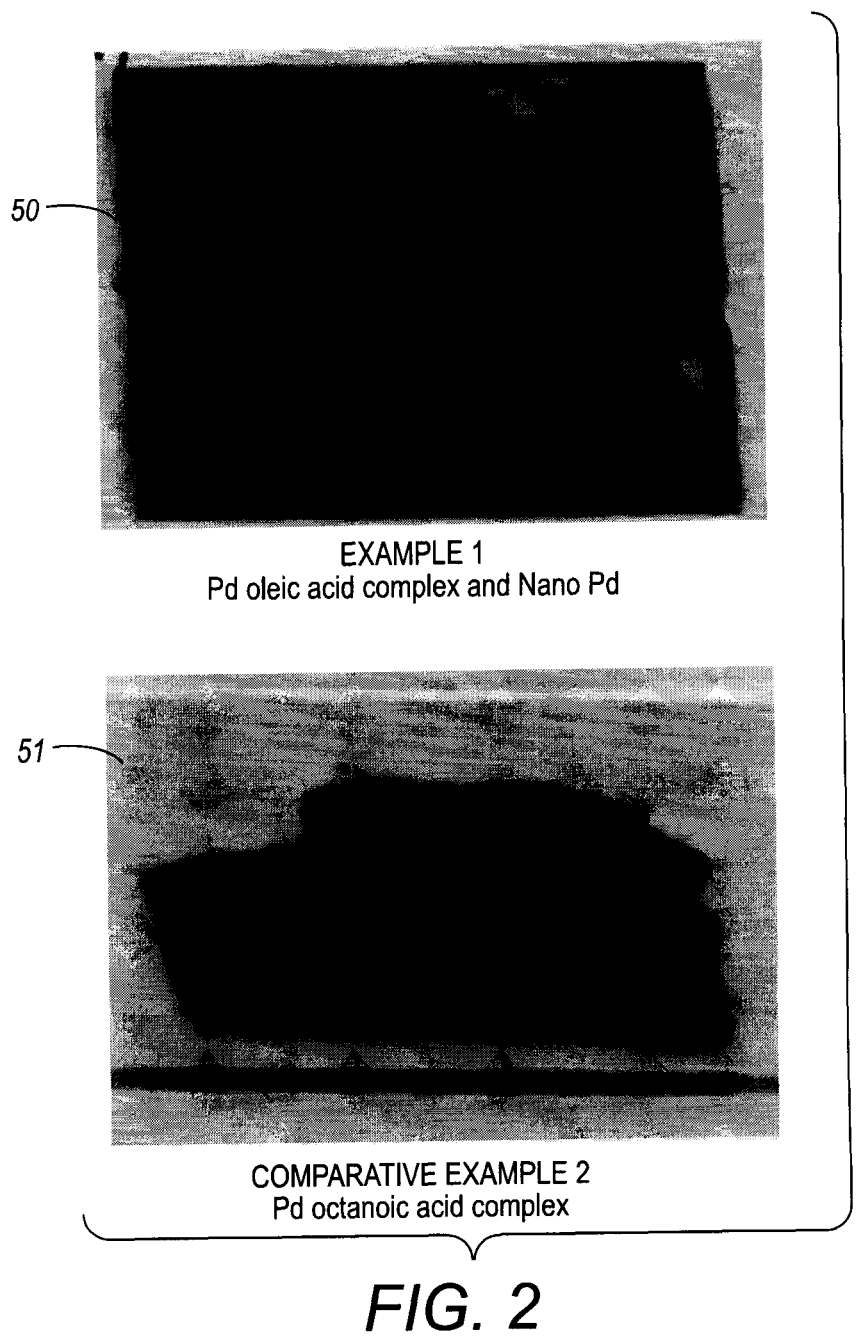
FIG. 2 is a picture of palladium film prepared according to the present disclosure compared with a palladium saturated carboxylate without palladium nanoparticles.

FIG. 2 is a picture of palladium film prepared according to the present disclosure 50 compared with a palladium film produced with a first composition containing a saturated palladium carboxylate without palladium nanoparticles 51.

The palladium film prepared by the present disclosure is very smooth and without porosity. On the other hand, the film produced by a first composition containing a saturated palladium carboxylate without palladium nanoparticles may result in textured surfaces with some porosity.

EXAMPLES

The following examples are for purposes of further illustrating the present disclosure.

Example 1

Palladium acetate (trimer) was purchased from Alfa Aesar. 0.1 grams (g) of palladium acetate, 0.3 g oleic acid, and 0.3 g of decalin were mixed together to form a first composition. The mixture was warmed to about 80° C. and stirred for about 30 minutes. Upon heating, the solution became a red-brownish, indicating the formation of palladium nanoparticles in a second composition.

The second composition was spin coated on a glass substrate at 1,000 rpm, resulting in an amorphous film. Annealing was performed after spin coating at about 200° C. to about 250° C. on a hotplate until a shiny, silver color metal film was formed on the substrate.

The palladium film showed very good scratch resistance and excellent adhesion. The conductivity, when measured using the 4-probe method, was $4.5 \times 10^4$ S/m.

Example 2

The first composition was prepared similar to Example 1, except that 0.2 g of toluene was used as the solvent. A copper wire was dipped in the first composition for a few seconds, followed by annealing in an oven at about 220° C. to about 230° C. A very robust and shiny palladium coating was formed on the copper wire.

Comparative Example 1

Palladium acetate (trimer) was purchased from Alfa Aesar. 0.1 g of palladium acetate was added into 0.2 g of toluene. The mixture was heated to reflux. However, the palladium acetate did not dissolve in the toluene. Therefore, it could not be used to form a palladium layer on a substrate.

Comparative Example 2

Palladium acetate (trimer) was purchased from Alfa Aesar. 0.1 g of palladium acetate was added into 0.2 g of toluene, followed by 0.1 g of octanoic acid, a saturated carboxylic acid. The mixture was warmed to a temperature of about 80° C. Although the palladium acetate was dissolved with the assistance of octanoic acid, forming a blood red solution, no Pd nanoparticles were formed. After coating the palladium carboxylic salt solution on glass slide and annealed at 200-250° C., no continuous Pd film was formed except Pd islands (FIG. 2, 51).

It will be appreciated that variations of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method comprising:
   warming a first composition comprising at least one palladium salt and at least one unsaturated carboxylic acid to form a second composition comprising stable palladium nanoparticles and at least one palladium unsaturated carboxylate, wherein the first composition is substantially free of an additional reducing agent.

2. The method of claim 1, wherein the unsaturated carboxylic acid of the first composition is of the formula:

$$R^1-CH=CH-R^2-COOH,$$

wherein $R^1$ represents a hydrogen or a hydrocarbon group having from about 1 carbon atom to about 25 carbon atoms, and $R^2$ represents a hydrocarbon group having from about 1 to about 25 carbon atoms, wherein the hydrocarbon group of $R^1$ and/or $R^2$ is independently selected from the group consisting of a substituted or unsubstituted alkyl, alkenyl, alkynyl, aryl and mixtures thereof, wherein the palladium salt of the first composition is of the formula:

$$Pd(X)_2,$$

wherein X is any counter ion to palladium, or mixture thereof, and wherein the palladium unsaturated carboxylate of the second composition may be of the formula:

$$(R^1-CH=CH-R^2-COO)_a PdX_b,$$

wherein a represents the number of the unsaturated carboxylate(s) complexed with palladium and b represents the number of counter ion(s), wherein a and b are real numbers or fractions, a is larger than zero, and a+b=2.

3. The method of claim 1, wherein the second composition further comprises the at least one unsaturated carboxylic acid, wherein the palladium nanoparticles are stabilized with the unsaturated carboxylic acid and the nanoparticles have a stability of at least 1 day.

4. The method of claim 1, wherein the first composition further comprises a hydrocarbon solvent.

5. The method of claim 1, wherein the at least one unsaturated carboxylic acid is a solvent.

6. The method of claim 1, wherein the at least one palladium salt is selected from the group consisting of palladium acetate, palladium chloride, palladium nitrate, palladium sulfate, palladium iodide, palladium cyanide, ethylenediamine palladium chloride, tetraaminepalladium bromide, bis(acetylacetonato)palladium, diamine dinitro palladium, and mixtures thereof, and wherein the palladium salt is from about 1 to about 50 weight percent of the first composition, and wherein the molar ratio of the unsaturated carboxylic acid to the palladium salt is from about 1:5 to about 10:1.

7. The method of claim 1, wherein the first composition is warmed to a temperature of less than about 150° C. and wherein the warming is performed for a period of from about 0.1 seconds to about 60 minutes.

8. The method of claim 1 further comprising:
   solution depositing the second composition upon a substrate; and
   heating the second composition to form a palladium layer on the substrate.

9. The method of claim 8, wherein the solution depositing comprises spin coating, dip coating, spray coating, slot die coating, flexographic printing, offset printing, screen printing, gravure printing, or inkjet printing the second composition onto the substrate.

10. The method of claim 8, wherein the heating is performed at a temperature of about 90° C. to about 350° C. for a period of from about 1 second to about 1 hour.

11. The method of claim 8, wherein the palladium layer has a conductivity of at least about 1,000 S/cm and has a surface roughness less than about 10 nm.

12. A composition comprising at least one palladium unsaturated carboxylate and palladium nanoparticles, the composition having a stability of at least 1 day.

13. The composition of claim 12, the composition further comprising an unsaturated carboxylic acid, wherein the palladium nanoparticles are stabilized with the unsaturated carboxylic acid.

14. The composition of claim 12, wherein the palladium unsaturated carboxylate is derived from an unsaturated carboxylic acid selected from the group consisting of oleic acid, heptenoic acid, octenoic acid, citronellic acid, 2-ethyl-2-hexenoic acid, dimethyl-4-pentenoic acid, crotonic acid, vinylacetic acid, tiglic acid, pentenoic acid, 2-methyl-2-pentenoic acid, undecylenic acid, myristoleic acid, palmitoleic acid, elaidic acid, eicosenoic acid, erucic acid, nervonic acid, trans-2,4-pentadienoic acid, 2-4-hexadienoic acid, 2,6-heptadienoic acid, geranic acid, linoleic acid, eicosadienoic acid, linolenic acid, eicosatrienoic acid, arachidonic acid, eicosapentaenoic acid, docosahexaenoic acid, itaconic acid, citraconic acid, mesaconic acid, traumatic acid, muconic acid, and mixtures thereof.

15. The composition of claim 12, wherein the molar ratio of the at least one palladium unsaturated carboxylate to the palladium nanoparticles is from about 99:1 to about 1:99, based on the mole of palladium atom.

16. The composition of claim 12, wherein the composition further comprises an organoamine as a complexing agent.

17. The composition of claim 12, the composition is substantially free of an additional reducing agent other than the unsaturated carboxylate.

18. The composition of claim 12, wherein the composition has a viscosity from about 5 cps to about 5,000 cps at room temperature.

19. A composition comprising at least one palladium unsaturated carboxylate and stable palladium nanoparticles, formed by a process of:
    warming a first composition comprising at least one palladium salt and at least one unsaturated carboxylic acid to form a second composition comprising the at least one palladium unsaturated carboxylate and the palladium nanoparticles, wherein the first composition is substantially free of an additional reducing agent.

20. The composition of claim 19, wherein the second composition further comprises the at least one unsaturated carboxylic acid, wherein the palladium nanoparticles being stabilized with the unsaturated carboxylic acid, and the nanoparticles have stability of at least 1 day.

21. The composition of claim 19, wherein the first composition is warmed to a temperature of less than about 150° C. for a period of from about 0.1 seconds to about 60 minutes.

22. The composition of claim 19, wherein the palladium salt is from about 1 to about 50 weight percent of the first composition, and wherein the molar ratio of the unsaturated carboxylic acid to the palladium salt is from about 1:5 to about 10:1.

\* \* \* \* \*